United States Patent
Chou et al.

(10) Patent No.: US 7,253,666 B2
(45) Date of Patent: Aug. 7, 2007

(54) CLOCK FREQUENCY DIVIDER CIRCUIT AND METHOD OF DIVIDING CLOCK FREQUENCY

(75) Inventors: Min-Chung Chou, Hsinchu (TW); Shu-Fang Wu, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 11/162,160

(22) Filed: Aug. 31, 2005

(65) Prior Publication Data

US 2007/0046340 A1   Mar. 1, 2007

(51) Int. Cl.
 *H03K 21/00* (2006.01)
(52) U.S. Cl. .................... 327/115; 327/117; 377/48
(58) Field of Classification Search ............... 327/115, 327/117, 113; 377/110, 105, 47, 48
See application file for complete search history.

(56) References Cited

U.S. PATENT DOCUMENTS

| 4,348,640 A | 9/1982 | Clendening | 328/41 |
| 4,866,741 A | 9/1989 | Minuhin | 377/48 |
| 4,951,303 A * | 8/1990 | Larson | 377/110 |
| 5,764,584 A * | 6/1998 | Fukiage et al. | 365/230.03 |
| 6,646,465 B2 * | 11/2003 | Bal | 326/40 |

* cited by examiner

*Primary Examiner*—Dinh T. Le
(74) *Attorney, Agent, or Firm*—Jianq Chyun IP Office (57) ABSTRACT

A clock frequency divider circuit and method of dividing a clock frequency are provided. The clock frequency divider circuit includes a first flip-flop circuit, a second flip-flop circuit, a third flip-flop circuit, a first logic control unit and a second logic control unit, wherein the first flip-flop circuit has two clock input terminals connected to the second and third flip-flop circuits respectively and two control signal input terminals connected to the first and second logic control units respectively. The second and third flip-flop circuits count rising edges and falling edges of an input frequency under control of the first and second flip-flop circuits and accordingly, symmetric output signals are output from the first flip-flop circuit.

20 Claims, 7 Drawing Sheets

CLOCK FREQUENCY DIVIDER CIRCUIT AND METHOD OF DIVIDING CLOCK FREQUENCY

BACKGROUND OF THE INVENTION

1. Field of Invention

The present invention relates to a clock frequency divider circuit and method of dividing a clock frequency. More particularly, the present invention relates to a clock frequency divider circuit and method of dividing a clock frequency for outputting symmetric output signals.

2. Description of Related Art

Clock frequency divider circuits, already widely applied in Integrated Circuits (IC), divide a frequency of an input clock signal to generate output clock signals having divided frequency. In one of the conventional clock frequency divider circuits, as disclosed in U.S. Pat. No. 4,866,741, positive output terminals and negative output terminals of two D flip-flop circuits are connected to an AND gate circuit and a OR gate circuit respectively to divide external clock signals for outputting clock signals with divided frequencies. However, the output clock signals from this conventional clock frequency divider circuit is not symmetric, which means the duty cycle thereof is not always 50%, and accordingly, the rising edges and falling edges of the output clock signals are not ideal for the next circuit stages. Further, if the duty cycle of the higher (or divided) frequencies of the output clock signals is not always 50%, then the positive or negative cycles of the output clock signals is too short and not preferred.

In another conventional clock frequency divider circuit, as disclosed in U.S. Pat. No. 4,348,640, outputting signals from two JK flip-flop circuits are operated by several logic gate circuits for controlling a D flip-flop circuit and external clock signals that are functioned as control signals for the two JK flip-flop circuits. Then, an output signal from the D flip-flop circuit has a duty cycle of 50%. However, this conventional clock frequency divider circuit is only capable of dividing the input clock signals by three and not by four, five . . . etc, which means it is not programmable and flexible.

Therefore, a programmable clock frequency divider circuit for outputting symmetric output clock signals is required.

SUMMARY OF THE INVENTION

One of the aspects of the invention is to provide a clock frequency divider circuit and method of dividing a clock frequency for outputting symmetric output signals.

Another aspect of the invention is to provide a programmable clock frequency divider circuit and method of dividing a clock frequency.

In one embodiment, a clock frequency divider circuit includes a first flip-flop circuit, a second flip-flop circuit, a third flip-flop circuit, a first logic control unit and a second logic control unit. The first flip-flop circuit has two clock input terminals connected to the second and third flip-flop circuits respectively and two control signal input terminals connected to the first and second logic control units respectively. The second and third flip-flop circuits count rising edges and falling edges of an input frequency under control of the first and second flip-flop circuits and accordingly, symmetric output signals are output from the first flip-flop circuit.

In another embodiment, a clock frequency divider circuit includes a first flip-flop circuit, a second flip-flop circuit, a third flip-flop circuit, a first logic control unit and a second logic control unit. The first flip-flop circuit has two clock input terminals connected to the second and third flip-flop circuits respectively and two control signal input terminals connected to the first and second logic control units respectively. A fourth flip-flop circuit is connected to the first logic control unit and the second flip-flop circuit. By this configuration, a programming function is made.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
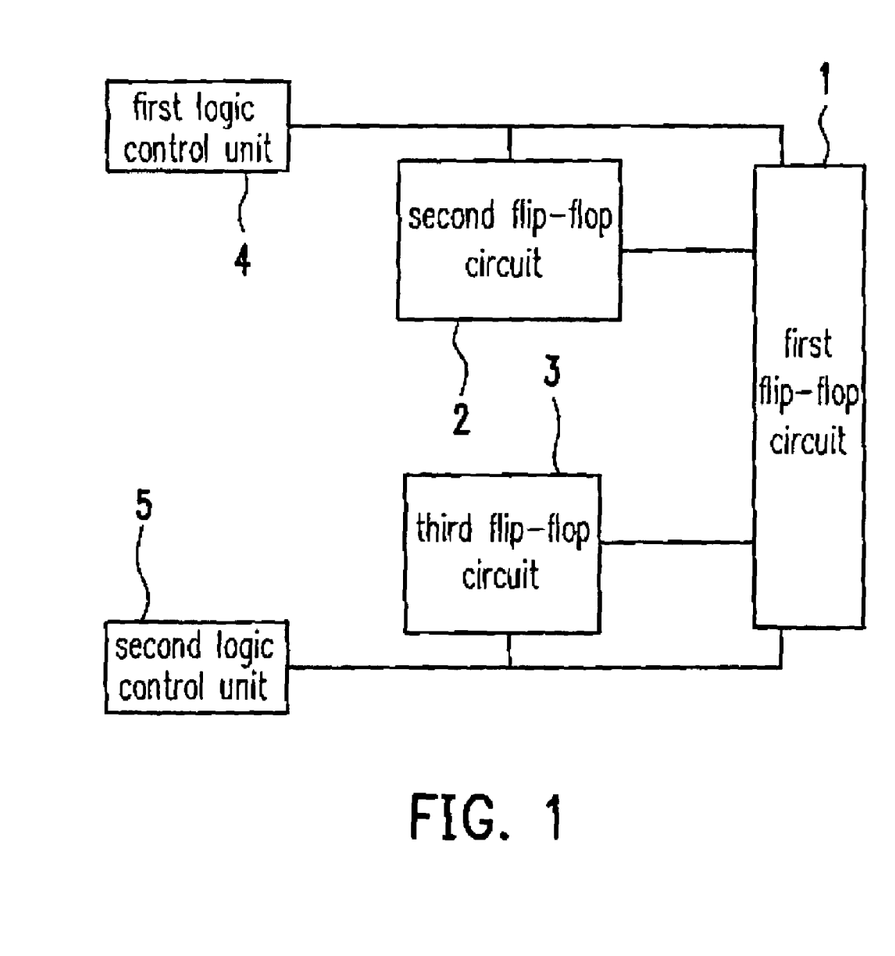
FIG. 1 is a block diagram of a clock frequency divider circuit according to a first embodiment of the invention.
Figure 2:
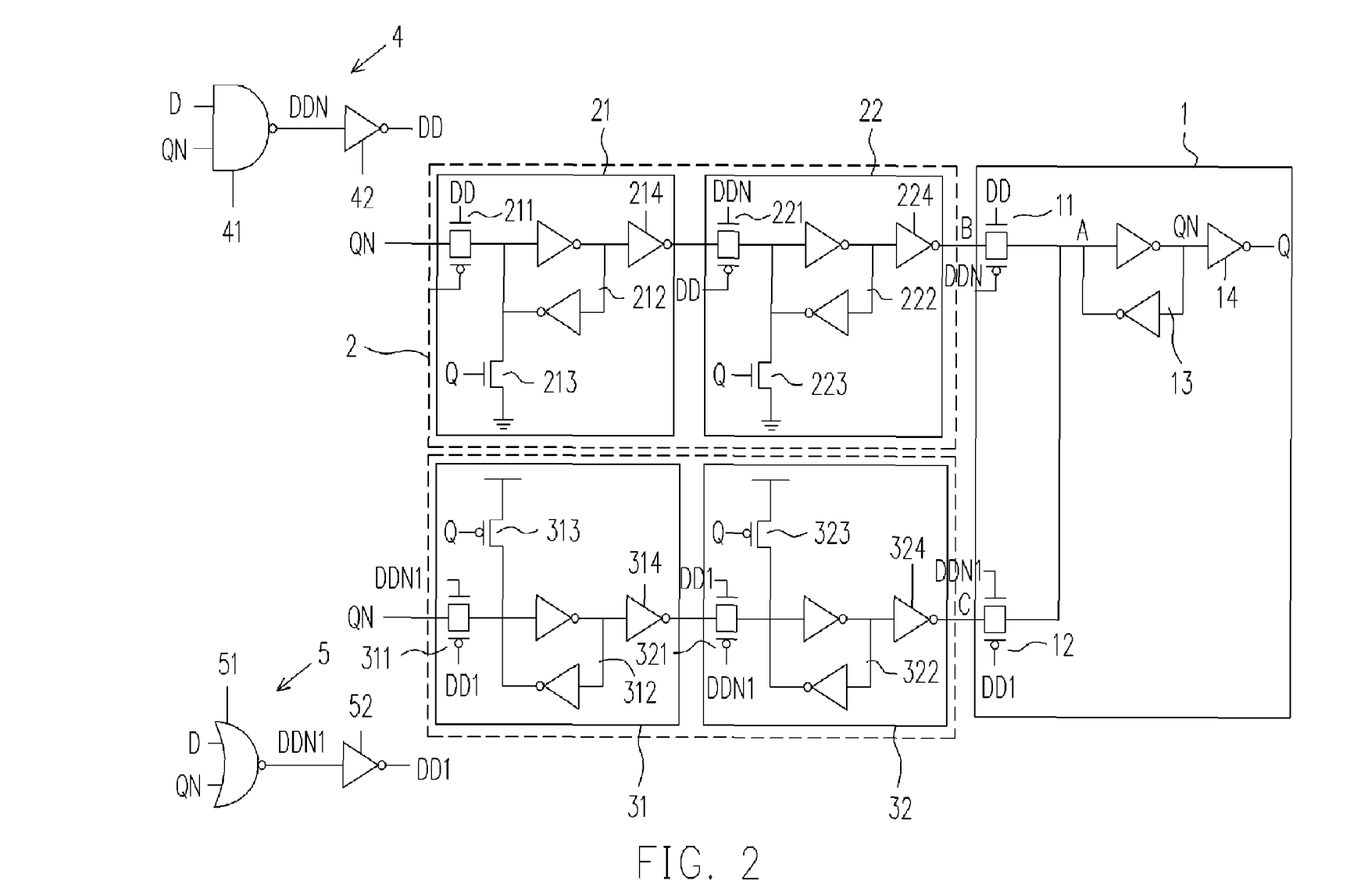
FIG. 2 is a detailed configuration of the clock frequency divider circuit in FIG. 1.
Figure 3:
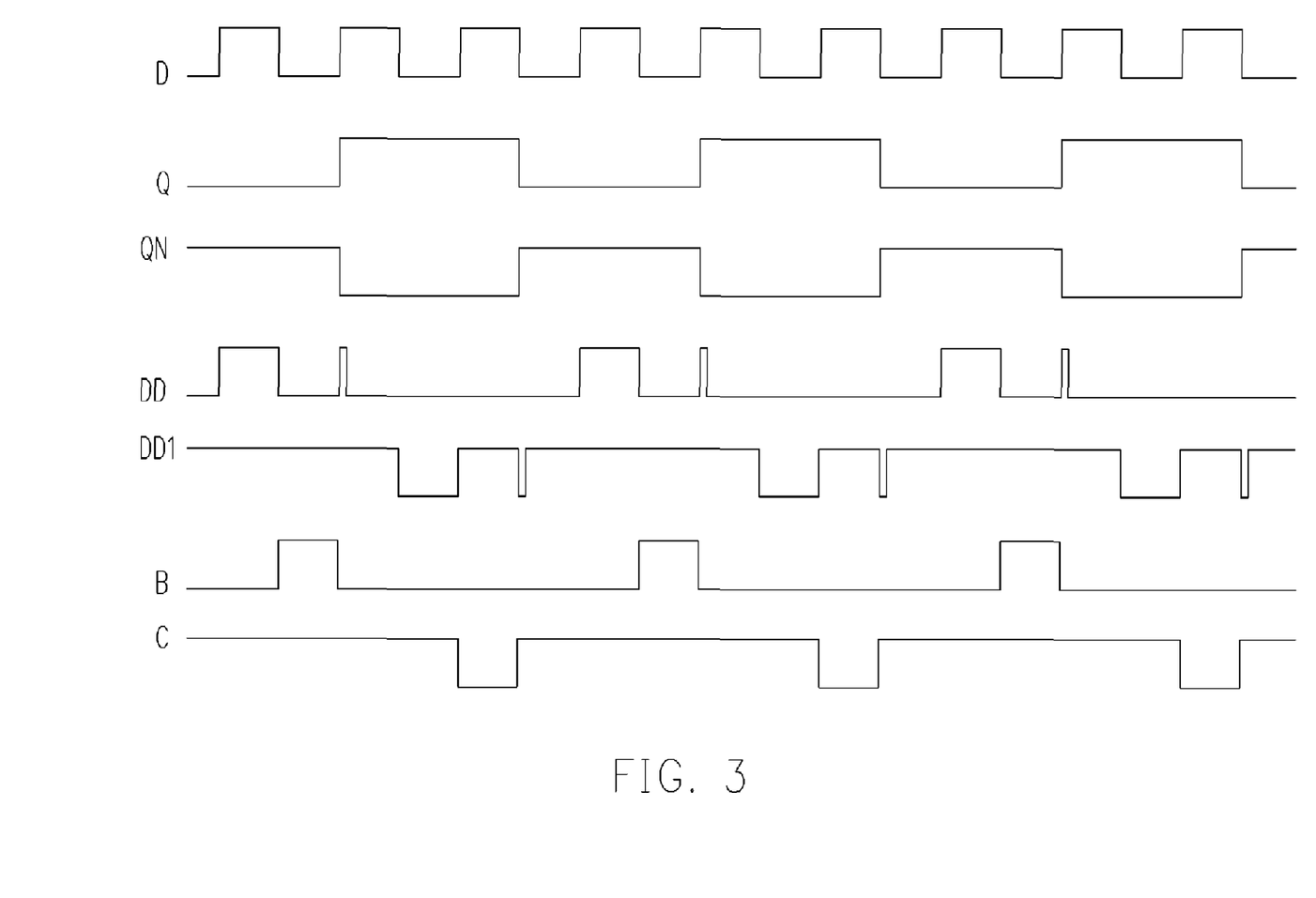
FIG. 3 is a waveform diagram of the clock frequency divider circuit in FIG. 1.

FIG. 1 is a block diagram of a clock frequency divider circuit according to a first embodiment of the invention. FIGS. 2 and 3 are detailed circuit configuration and signal waveforms of FIG. 1. Please refer to FIGS. 1 and 2, the clock frequency divider circuit according to the first embodiment at least includes a first flip-flop circuit 1, a second flip-flop circuit 2, a third flip-flop circuit 3, a first logic control unit 4 and a second logic control unit 5. The first flip-flop circuit 1 has: an output terminal; two clock input terminals connecting to the second and third flip-flop circuits 2 and 3 respectively; and two control signal input terminals connected to the first and second logic control units 4 and 5 respectively.

The first logic control unit 4 includes an NAND gate 41 and an inverter 42. The NAND gate 41 receives an external clock signal D and an output signal QN from the first flip-flop circuit 1 to output a signal DDN to the inverter 42 and the inverter 42 inverts the signal DDN into an output signal DD.

The second flip-flop circuit 2 includes first and second D flip-flops 21 and 22. The first D flip-flop 21 includes a transmission gate 211, a latch 212, an NMOS transistor 213 and an inverter 214. The second D flip-flop 22 includes a transmission gate 221, a latch 222, an NMOS transistor 223 and an inverter 224. The transmission gates 221 and 222 are controlled by signals DD and DDN. When DD is logic 1 and DDN is logic 0, the transmission gates 211 and 221 are turned on and off respectively. On the contrary, if DD is logic 0 and DDN is logic 1, the transmission gates 211 and 221 are turned off and on respectively. When the transmission gate 211 is ON, the input signal QN is transmitted into and latched by the latch 212. Then, the inverter 214 inverts an output signal from the latch 212 and outputs into the transmission gate 221. After the transmission gate 221 is ON, the output signal from the inverter 214 is transmitted into and latched by the latch 222. Then, the inverter 224 inverts an output signal from the latch 222 and outputs an output signal B into an input terminal of the first flip-flop circuit 1. An output signal Q from the first flip-flop circuit 1 inputs into gate terminals of the NMOS transistors 213 and 223. When the output signal Q is Logic 1, signals latched by the latches 212 and 222 are reset as Logic 0.

The second logic control unit 5 includes an NOR gate 51 and an inverter 52. The NOR gate 51 receives the external clock signal D and the output signal QN from the first flip-flop circuit 1 to output a signal DDN1 to the inverter 52 and the inverter 52 inverts the signal DDN1 into an output signal DD1.

The third flip-flop circuit 3 includes third and fourth D flip-flops 31 and 32. The first D flip-flop 31 includes a transmission gate 311, a latch 312, a PMOS transistor 313 and an inverter 314. The fourth D flip-flop 32 includes a transmission gate 321, a latch 322, a PMOS transistor 323 and an inverter 324. The transmission gates 321 and 322 are controlled by signals DD1 and DDN1. When DD1 is logic 1 and DDN1 is logic 0, the transmission gates 321 and 322 are turned on and off respectively. On the contrary, if DD1 is logic 0 and DDN1 is logic 1, the transmission gates 311 and 321 are turned off and on respectively. When the transmission gate 311 is ON, the input signal QN is transmitted into and latched by the latch 312. Then, the inverter 314 inverts an output signal from the latch 212 and outputs into the transmission gate 321. After the transmission gate 321 is ON, the output signal from the inverter 314 is transmitted into and latched by the latch 322. Then, the inverter 324 inverts an output signal from the latch 322 and outputs an output signal C into another input terminal of the first flip-flop circuit 1. The output signal Q from the first flip-flop circuit 1 inputs into gate terminals of the PMOS transistors 313 and 323. When the output signal Q is Logic 0, signals latched by the latches 312 and 322 are reset as Logic 1.

The first flip-flop circuit 1 at least includes two transmission gates 11 and 12, a latch 13 and an inverter 14. The transmission gates 11 and 12 are controlled by signals DD and DDN. Input terminals of the transmission gates 11 and 12 receive the output signal B from the second flip-flop circuit 2 and the output signal C from the third flip-flop circuit 3 respectively. Output terminals of the transmission gates 11 and 12 commonly connect to an input terminal A of the latch 13. The latch 13 latches signals B or C and outputs the output signal QN. The output signal QN is inverted by the inverted into the output signal Q.

The frequency divider circuit is at least capable of performing a divided-by-three operation. As discussed above, the signal DD is a result from NAND and inverting operations of the signals D and QN. If the signals D and QN are both Logic 1, the signal DD is Logic 1. If at least one the signals D and QN is Logic 0, the signal DD is Logic 0. If the signal Q is Logic 0, which means the signal QN is defaulted as Logic 1, then the signal DD is Logic 0. When the external clock signal D is transited from logic 0 into logic 1, the signal DD is changed into logic 1 to turn on the transmission gate 211 and latch logic 1 QN in the latch 212. When the external clock signal D is transited from logic 1 into logic 0,the signal DD is changed into logic 0 to turn on the transmission gate 221 and latch logic 1 QN in the latch 222. When the external clock signal D is transited from logic 0 into logic 1 again, the signal DD is changed into logic 1 to turn on the transmission gate 11 and latch logic 1 QN in the latch 13. Then, the output signal Q is changed into logic 1 to reset signals latched in the latches 212 and 222 as logic 0.

As discussed above, the signal DD1 is a result from NOR and INV operations of the signals D and QN. If the signals D and QN are both Logic 0, the signal DD1 is Logic 0. If at least one the signals D and QN is Logic 1, the signal DD1 is Logic 1. When the output signal Q from the first flip-flop circuit 1 is transited into logic 1 (which means the signal QN is changed into logic 0) and the external clock signal D is logic 1, the signal DD1 is logic 1. After the external clock signal D is changed from logic 1 into logic 0,the signal DD1 is changed into logic 0 to turn on the transmission gate 311 and latch logic 0 QN in the latch 312. When the external clock signal D is transited from logic 0 into logic 1, the signal DD1 is changed into logic 1 to turn on the transmission gate 321 and latch logic 0 QN in the latch 322. When the external clock signal D is transited from logic 1 into logic 0 again, the signal DD1 is changed into logic 0 to turn on the transmission gate 12 and latch logic 0 QN in the latch 13. Then, the output signal Q is changed into logic 0 to reset signals latched in the latches 312 and 322 as logic 1.

After the output signal Q from the first flip-flop circuit 1 is changed into logic 0, the signal QN is processed by the second flip-flop circuit 2 and then output to the first flip-flop circuit 1. After the output signal Q from the first flip-flop circuit 1 is changed into logic 1, the signal QN is processed by the second flip-flop circuit 3 and then output to the first flip-flop circuit 1. By this loop, the frequency of the external clock signal D is divided by three. Further, by counting rising and falling edges of the external clock signal D with the first, second and third flip-flop circuits 1, 2 and 3, duty cycles of the output signal Q from the first flip-flop circuit 1 is substantially 50%, which means the output signal Q is symmetric.

Figure 4:
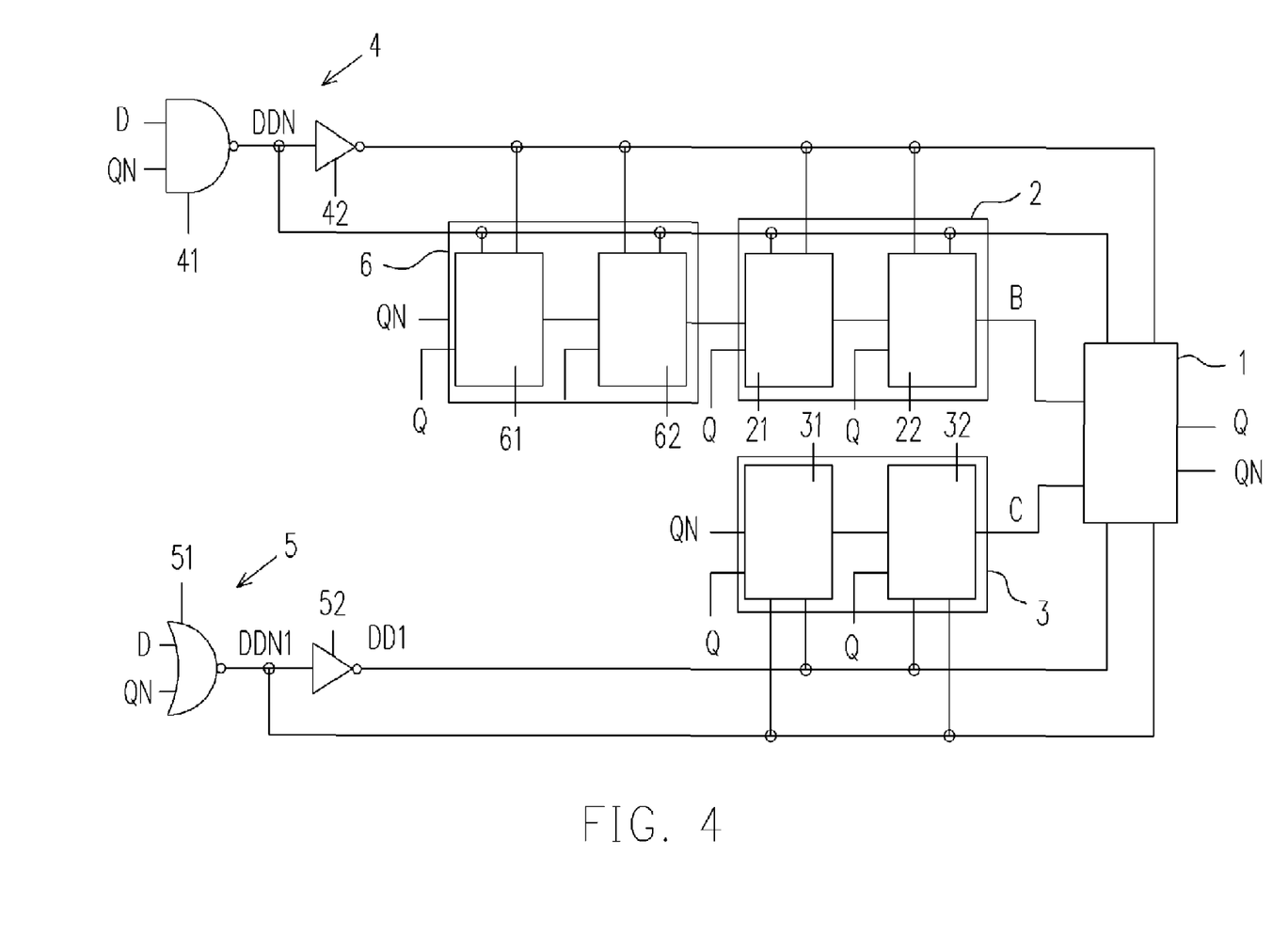
FIG. 4 is a block diagram of a clock frequency divider circuit according to a second embodiment of the invention.
Figure 5:
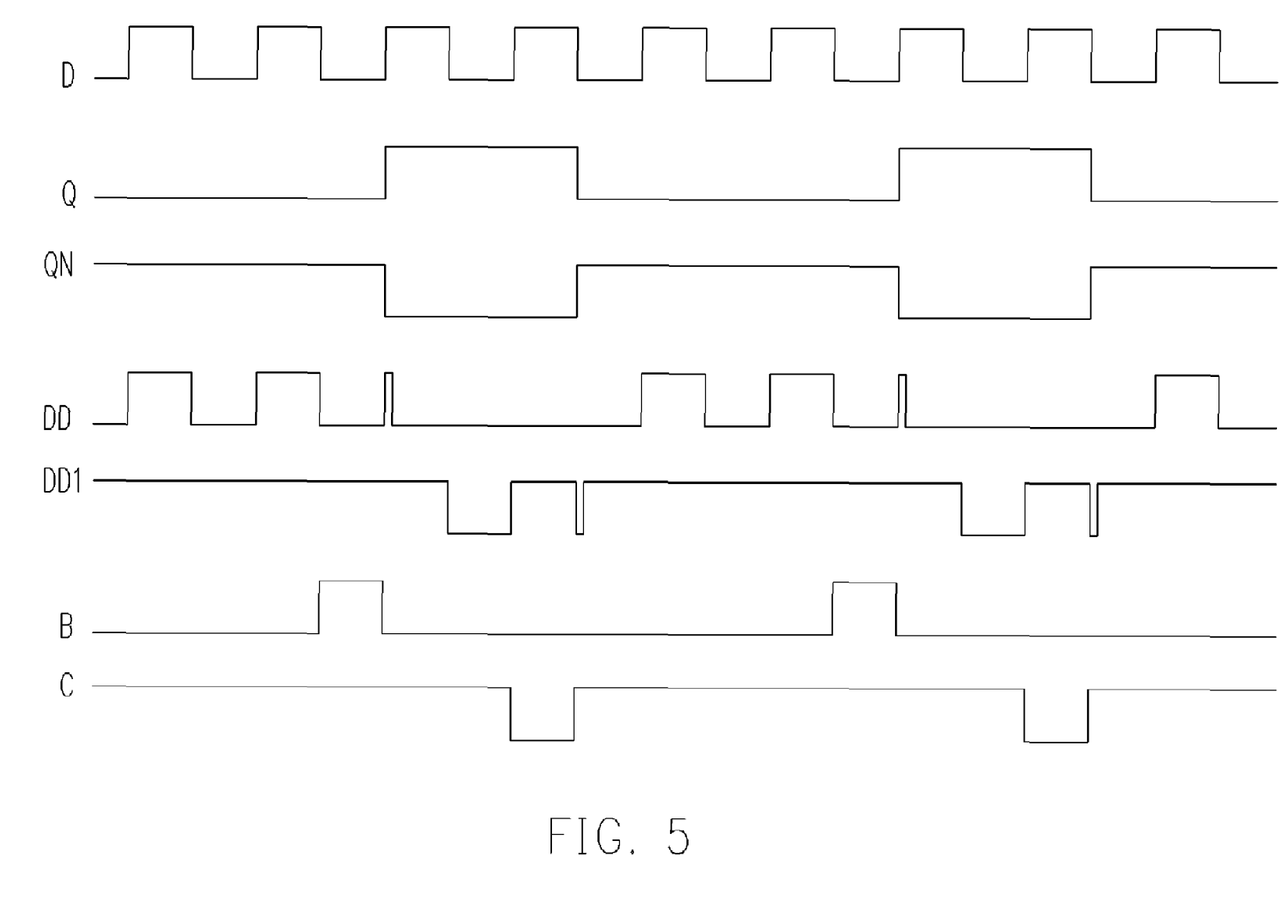
FIG. 5 is a waveform diagram of the clock frequency divider circuit in FIG. 4.

Please refer to FIGS. 4 and 5 showing a block diagram and waveforms according to a second embodiment of the invention. As shown, the clock frequency divider circuit includes a first flip-flop circuit 1, a second flip-flop circuit 2, a third flip-flop circuit 3, a first logic control unit 4 and a second logic control unit 5. The first flip-flop circuit 1 includes two clock signal input terminals connecting to the second and third flip-flop circuits 2 and 3 respectively and two control signal input terminals connecting to the first second logic control units 4 and 5. Further, a fourth flip-flop circuit 6 is connected to the first logic control unit 4 and the second flip-flop circuit 2. The fourth flip-flop circuit 6 includes a fifth D flip-flop 61 and a sixth D flip-flop 62. If an output signal Q from the first flip-flop circuit 1 is logic 0 (which means an output signal QN is logic 1) and an external clock D is logic 0,the signal QN is input into the fifth D flip-flop 61. When the external signal D is changed into logic 1, the "logic 1" signal QN is latched in the fifth D flip-flop

61. When the external signal D is changed into logic 0,the "logic 1" signal QN is latched in the sixth D flip-flop 62. When the external signal D is changed into logic 1, the "logic 1" signal QN is latched in the first D flip-flop 21. When the external signal D is changed into logic 0, the "logic 1" signal QN is latched in the second D flip-flop 22. When the external signal D is changed into logic 1, the "logic 1" signal QN is latched in the first flip-flop circuit 1 and the output signal Q from the first flip-flop circuit 1 is changed into logic 1, which means the signal QN is changed into logic 0. Accordingly, the signals latched in the D flip-flops 61, 62, 21 and 22 are reset as logic 0 and a "logic 0" signal QN is input into the third D flip-flop 31 of the third flip-flop circuit 3. When the external clock D is changed into logic 0,a "logic 0" signal QN is latched in the third D flip-flop 31. When the external clock D is changed into logic 1, a "logic 0" signal QN is latched in the fourth D flip-flop 32. When the external clock D is changed into logic 0,a "logic 0" signal QN is latched in the first flip-flop circuit 1 and the output signal Q from the first flip-flop circuit 1 is changed into logic 0,which means the signal QN is changed into logic 1. Accordingly, the signals latched by the D flip-flops 31 and 32 are reset as logic 1. The above operations are looped to divide the external clock D by 4.

Figure 6:
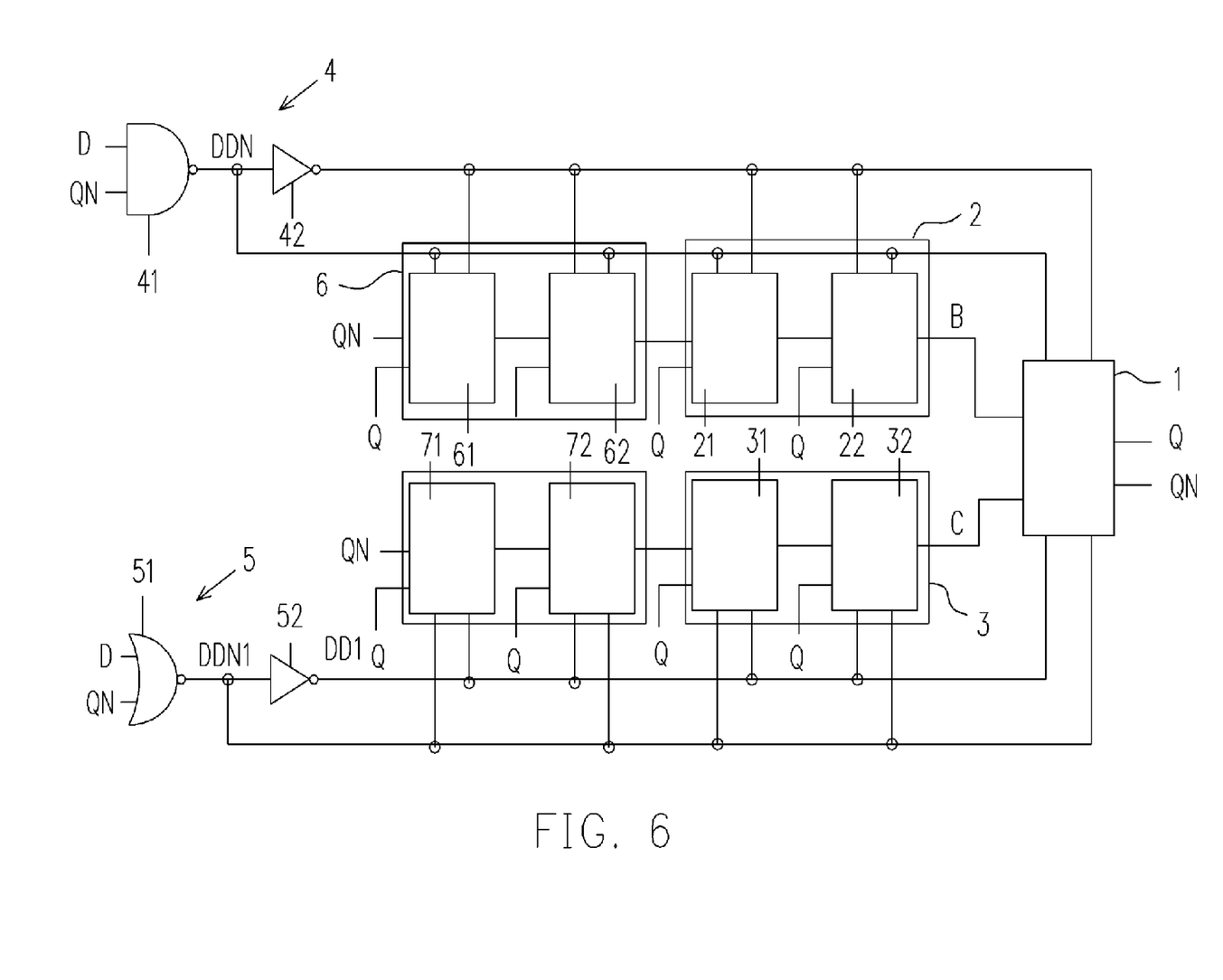
FIG. 6 is a block diagram of a clock frequency divider circuit according to a third embodiment of the invention.
Figure 7:
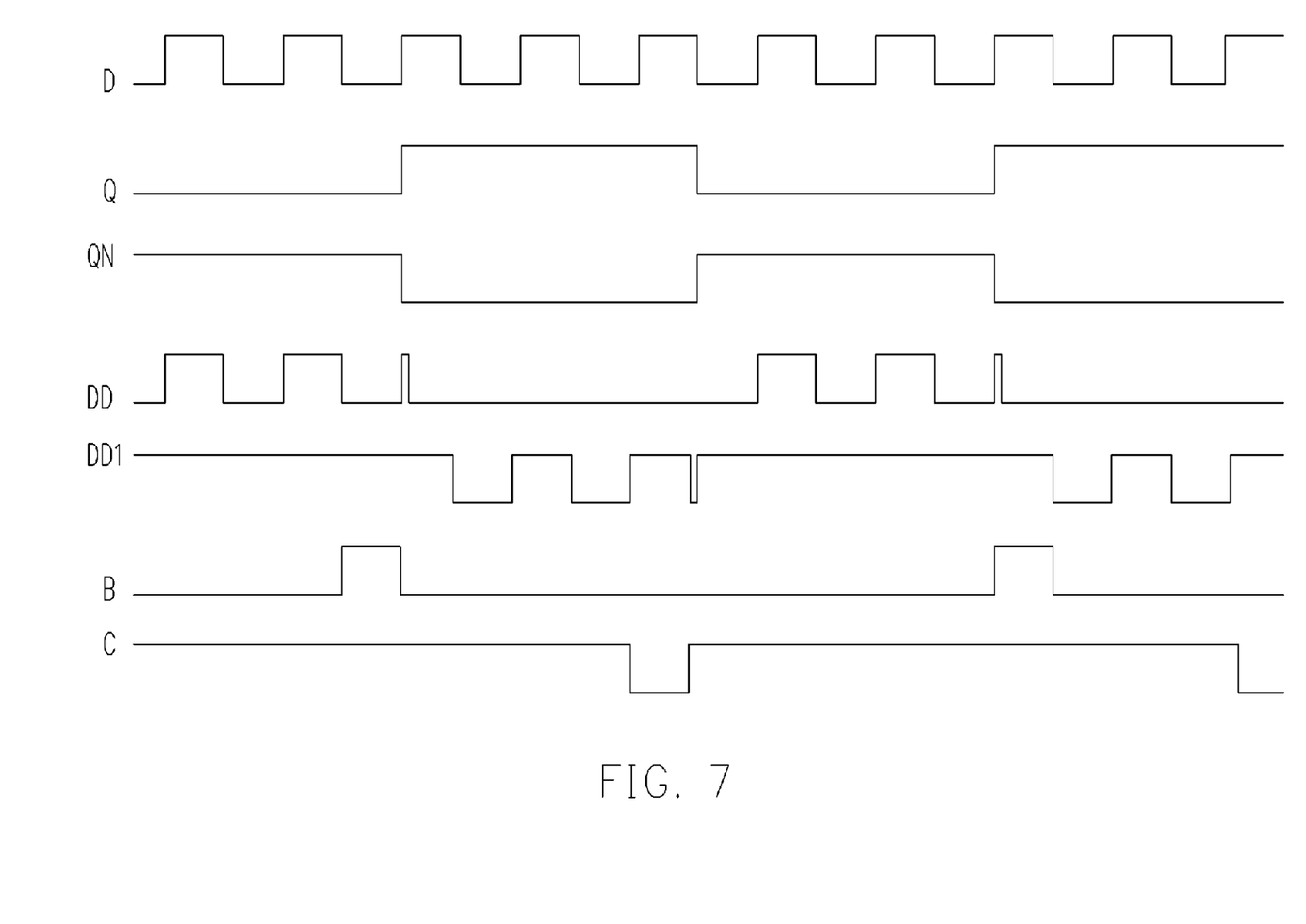
FIG. 7 is a waveform diagram of the clock frequency divider circuit in FIG. 6.

Please refer to FIGS. 6 and 7 showing a block diagram and waveforms according to a third embodiment of the invention. As shown, in addition to those in FIGS. 4 and 5, further, a fifth flip-flop circuit 7 is connected to the second logic control unit 5 and the third flip-flop circuit 3. The fifth flip-flop circuit 7 includes a seventh D flip-flop 71 and an eighth D flip-flop 72. If an output signal Q from the first flip-flop circuit 1 is logic 0 (which means an output signal QN is logic 1) and an external clock D is logic 0,the signal QN is input into the fifth D flip-flop 61. When the external signal D is changed into logic 1, the "logic 1" signal QN is latched in the fifth D flip-flop 61. When the external signal D is changed into logic 0,the "logic 1" signal QN is latched in the sixth D flip-flop 62. When the external signal D is changed into logic 1, the "logic 1" signal QN is latched in the first D flip-flop 21. When the external signal D is changed into logic 0,the "logic 1" signal QN is latched in the second D flip-flop 22. When the external signal D is changed into logic 1, the "logic 1" signal QN is latched in the first flip-flop circuit 1 and the output signal Q from the first flip-flop circuit 1 is changed into logic 1, which means the signal QN is changed into logic 0. Accordingly, the signals latched in the D flip-flops 61, 62, 21 and 22 are reset as logic 0 and a "logic 0" signal QN is input into the seventh D flip-flop 71 of the fifth flip-flop circuit 5. When the external clock D is changed into logic 0,a "logic 0" signal QN is latched in the seventh D flip-flop 71. When the external clock D is changed into logic 1, a "logic 0" signal QN is latched in the eighth D flip-flop 72. When the external clock D is changed into logic 0, a "logic 0" signal QN is latched in the third D flip-flop 31. When the external clock D is changed into logic 1, a "logic 0" signal QN is latched in the fourth D flip-flop 32. When the external clock D is changed into logic 0,a "logic 0" signal QN is latched in the first flip-flop circuit 1 and the output signal Q from the first flip-flop circuit 1 is changed into logic 0, which means the signal QN is changed into logic 1. Accordingly, the signals latched by the D flip-flops 71, 72, 31 and 32 are reset as logic 1. The above operations are looped to divide the external clock D by 5. If so, the output signal Q from the first flip-flop circuit 1 is symmetric and has a duty cycle of 50%.

Further, other further flip-flop circuits are connected to the fourth and fifth flip-flop circuits 6 and 7 for programming and symmetric output signals in response to divided-by-odd integer operations having duty cycles of 50% are made.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A clock frequency divider circuit, comprising:
   a first flip-flop circuit, having first and second clock input terminals and first and second control signal input terminals;
   a second flip-flop circuit, having a third control signal input terminal and an output terminal connected to the first clock input terminal;
   a third flip-flop circuit, having a fourth control signal input terminal and an output terminal connected to the second clock input terminal;
   a first logic control unit, having an output terminal connected to the first control signal input terminal of the first flip-flop circuit and the third control signal input terminal of the second flip-flop circuit; and
   a second logic control unit, having an output terminal connected to the fourth control signal input terminal of the third flip-flop circuit and the second control signal input terminal of the first flip-flop circuit.

2. The clock frequency divider circuit of claim 1, wherein the first flip-flop circuit includes two transmission gates, a latch and an inverter.

3. The clock frequency divider circuit of claim 1, wherein the second flip-flop circuit includes two D flip-flops.

4. The clock frequency divider circuit of claim 3, wherein the D flip-flop includes a transmission gate, a latch, an NMOS transistor and an inverter.

5. The clock frequency divider circuit of claim 1, wherein the third flip-flop circuit includes two D flip-flops.

6. The clock frequency divider circuit of claim 5, wherein the D flip-flop includes a transmission gate, a latch, a PMOS transistor and an inverter.

7. The clock frequency divider circuit of claim 1, wherein the first logic control unit includes:
   an NAND gate, receiving an external clock and an output signal from the first flip-flop circuit; and
   an inverter, receiving an output signal of the NAND gate.

8. The clock frequency divider circuit of claim 1, wherein the second logic control unit includes:
   an NOR gate, receiving an external clock and an output signal from the first flip-flop circuit; and
   an inverter, receiving an output signal of the NOR gate.

9. The clock frequency divider circuit of claim 1, further comprising a fourth flip-flop circuit connected to the second flip-flop circuit and the first logic control unit.

10. The clock frequency divider circuit of claim 1, further comprising a fifth flip-flop circuit connected to the third flip-flop circuit and the second logic control unit.

11. A method of dividing a frequency of a clock, comprising the steps of:
   functioning an external clock and an output signal from a first flip-flop circuit as inputs of a first logic control unit;
   controlling the rest flip-flop circuit and a second flip-flop circuit by the first logic control unit;
   functioning the external clock and the output signal from the first flip-flop circuit as inputs of a second logic control unit; and controlling the first flip-flop circuit and a third flip-flop circuit by the second logic control unit.

12. The method of claim 11, wherein the first flip-flop circuit includes two transmission gates, a latch and an inverter.

13. The method of claim 11 wherein the second flip-flop circuit includes two D flip-flops.

14. The method of claim 13, wherein the D flip-flop includes a transmission gate, a latch, an NMOS transistor and an inverter.

15. The method of claim 11, wherein the third flip-flop circuit includes two D flip-flops.

16. The method of claim 15, wherein the D flip-flop includes a transmission gate, a latch, a PMOS transistor and an inverter.

17. The method of claim 11, wherein the first logic control unit includes:

an NAND gate, receiving the external clock and the output signal from the first flip-flop circuit; and an inverter, receiving an output signal of the NAND gate.

18. The method of claim 11, wherein the second logic control unit includes:

an NOR gate, receiving the external clock and the output signal from the first flip-flop circuit; and an inverter, receiving an output signal of the NOR gate.

19. The method of claim 11, wherein the first logic control unit further controls operations of a fourth flip-flop circuit, the second flip-flop circuit and the first flip-flop circuit.

20. The method of claim 11, wherein the second logic control unit further controls operations of a fifth flip-flop circuit, the third flip-flop circuit and the first flip-flop circuit.

* * * * *